(12) United States Patent
Travis et al.

(10) Patent No.: US 7,146,593 B2
(45) Date of Patent: Dec. 5, 2006

(54) METHOD OF IMPLEMENTING POLISHING UNIFORMITY AND MODIFYING LAYOUT DATA

(75) Inventors: Edward O. Travis, Austin, TX (US); Nathan A. Aldrich, Pflugerville, TX (US); Ruiqi Tian, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 545 days.

(21) Appl. No.: 10/700,883

(22) Filed: Nov. 4, 2003

(65) Prior Publication Data

US 2005/0097490 A1   May 5, 2005

(51) Int. Cl.
  *G06F 17/50*    (2006.01)
  *H01L 21/302*   (2006.01)
(52) U.S. Cl. ............................. 716/10; 716/9; 438/692
(58) Field of Classification Search ............... 716/8–10; 438/692
  See application file for complete search history.

(56) References Cited

U.S. PATENT DOCUMENTS

| 4,627,005 A | * | 12/1986 | Doherty et al. ............... 716/15 |
| 6,225,697 B1 |   | 5/2001  | Iguchi |
| 6,748,574 B1 | * | 6/2004  | Sasagawa et al. ............. 716/9 |
| 2001/0027008 A1 |   | 10/2001 | Matsumoto |
| 2002/0106837 A1 |   | 8/2002  | Cleeves |
| 2002/0133797 A1 | * | 9/2002  | Sasagawa et al. ............. 716/9 |
| 2003/0229479 A1 | * | 12/2003 | Smith et al. .................. 703/14 |
| 2005/0132306 A1 | * | 6/2005  | Smith et al. .................. 716/1 |

FOREIGN PATENT DOCUMENTS

WO    WO 02/059943 A2    8/2002

OTHER PUBLICATIONS

Construction Analysis, IBM power PC 750 RISC Microprocessor (Copper) with TEM Analysis, Report No. SCA 9808-587, Integrated Circuit Engneering, Scottsdale, AZ, 3 pgs., Nov. 4, 2003.

* cited by examiner

*Primary Examiner*—Stacy A. Whitmore
(74) *Attorney, Agent, or Firm*—Kim-Marie Vo; Michael Balconi-Lamica

(57) ABSTRACT

A method for identifying areas of low overburden which degrade (increase) metal polish nonuniformity is discussed. Also described is a method for modifying these areas to increase their overburden, thus slowing down the metal polish rate and improving overall polish uniformity. The resulting structure forms slots in groups of functional lines, such as bus lines, when the functional lines have a density prior to forming the slots that exceeds a predetermined amount. In one embodiment, an area of the wafer has a maximum width of 1.5 microns in an area that has a feature density greater than approximately 50 percent. The methods and resulting structures create a higher feature density, thereby increasing polishing uniformity.

20 Claims, 7 Drawing Sheets

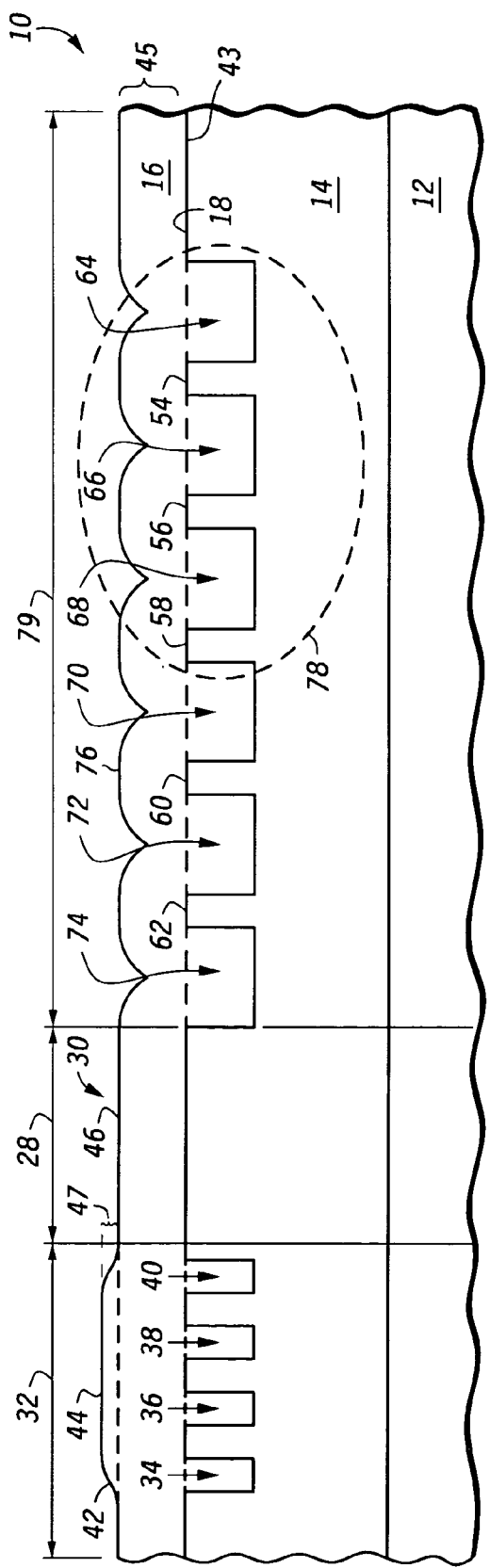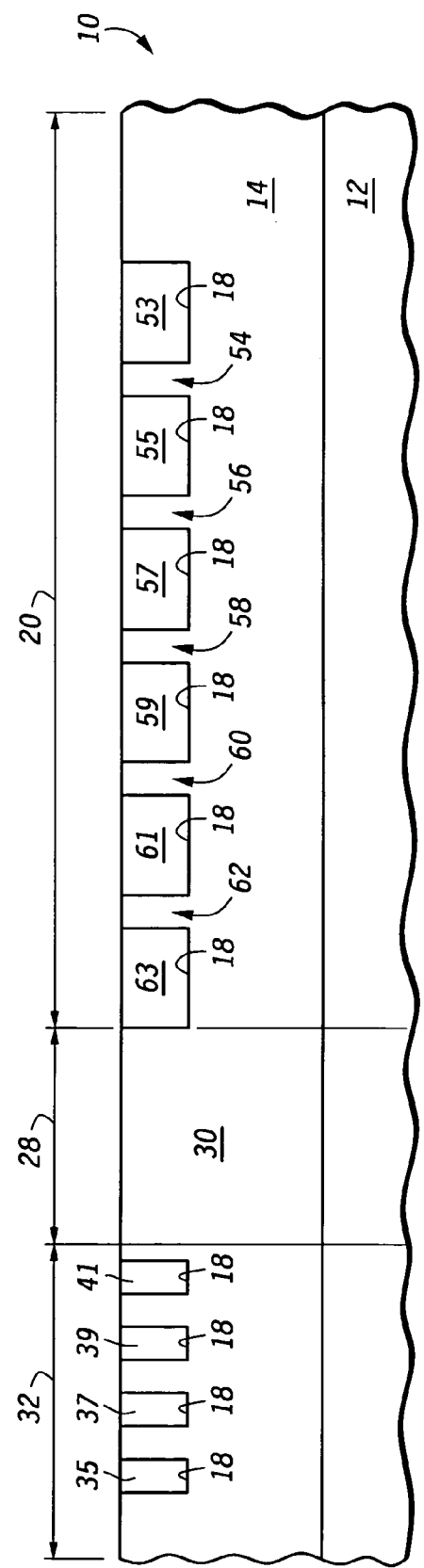

METHOD OF IMPLEMENTING POLISHING UNIFORMITY AND MODIFYING LAYOUT DATA

FIELD OF THE INVENTION

This invention relates generally to semiconductor devices, and more specifically, to planarizing or polishing a semiconductor device.

BACKGROUND

After depositing a material, such as a metal to form an interconnect, over a semiconductor substrate, the material is planarized using chemical mechanical polishing (CMP). However, the resulting topography after planarization is nonuniform across the semiconductor substrate.

To increase uniformity, many methods focus on the difference in layout density between areas on a semiconductor substrate. Furthermore, the methods focus on increasing the feature density in low density areas by forming tiles in order to increase the polishing rates. Solutions include adding material (i.e., tiles or dummy features) between areas having different densities, trying to balance the density of various areas, placing features far apart and forming tiles between them or to increase the spacing between subsequently formed metal layers to decrease the risk of leakage between them. However, these methods increase the area needed for the features (e.g., the interconnects) making it difficult to decrease the overall size of a semiconductor die. Furthermore, nonuniformity is often not improved. Thus, a need exists for a method to improve uniformity without increasing the area need for placement of the features.

BRIEF DESCRIPTION OF THE DRAWINGS

The present invention is illustrated by way of example and is not limited by the accompanying figures, in which like references indicate similar elements.

FIG. 2A illustrates a modification of the semiconductor device in FIG. 1A in accordance with an embodiment of the present invention;

FIG. 2B illustrates the semiconductor device of FIG. 2A after planarization;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Problem areas for polishing are usually step transistions. A step transition in overburden value may be approximately 50% with a distance of 50 to 100 micron from a furthest measuring point on one side of the step to the furthest measuring point on the other side of the step. For example, within a 50 to 100 microns distance one side of the step may have an overburden value of 100% or 1 and the other side of the step may have an overburden value of 50% or 0.5. While many embodiments discussed herein refer to the overburden value as a percentage, it is not necessary that a percentage be used. Instead, for example, an absolute value may be used.

A valley transition is the combination of two step transistions so that a trench is formed. Thus, the valley transition is a high-low-high transition. The average transition of overburden value in a valley transition may be approximately 25% or greater for a distance where each step transition that forms the valley transition is within the distances described above for the step transition (i.e., 50 to 100 microns measured from the furthest measuring point on one side of the step to the furthest measuring point on the other side of the step.)

Figure 4:
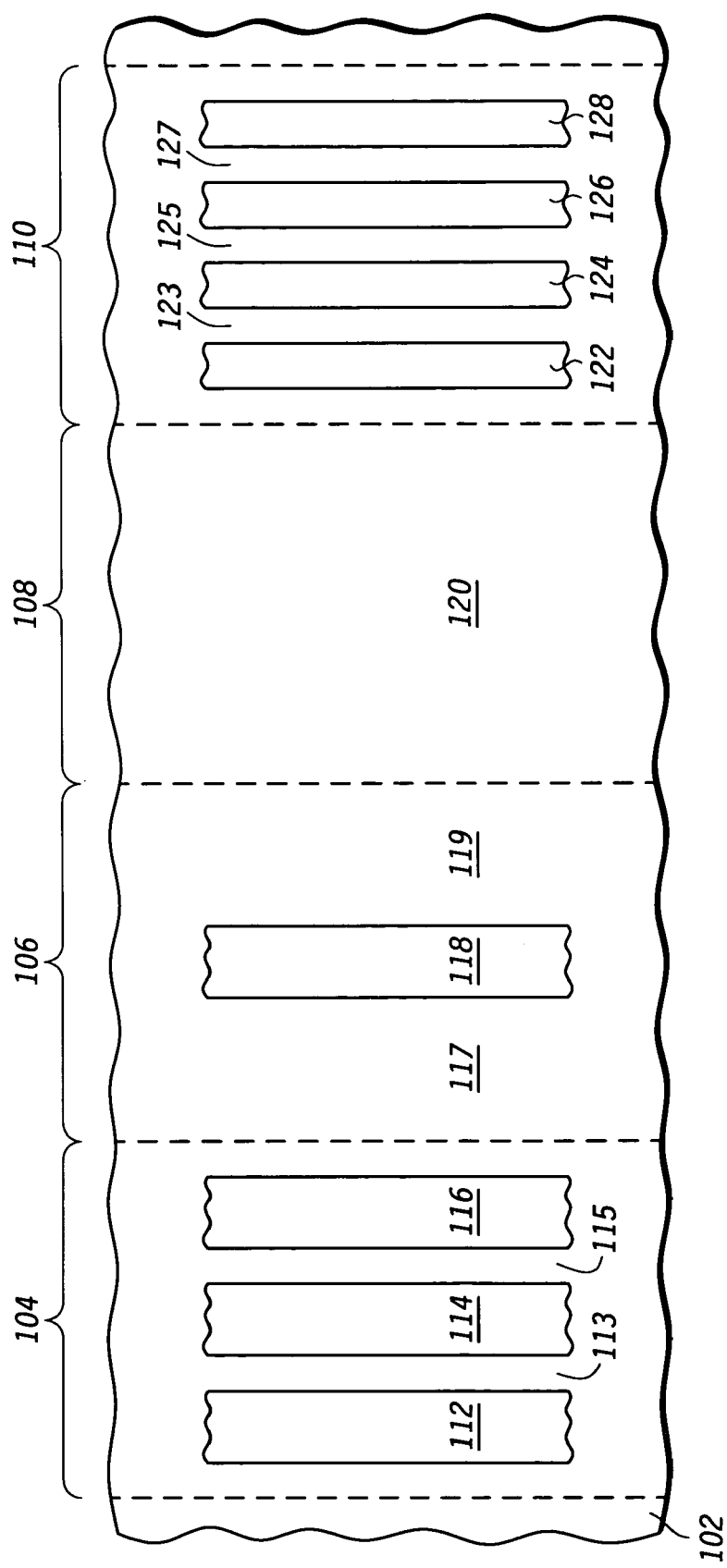
FIG. 4 illustrates different density areas on a semiconductor wafer.

In FIG. 4 area 108 has an overburden value of approximately 100% and areas 104 and 106 have overburden values less than 100%, where the area 104 has the lowest overburden value, such as 20% for example. Therefore, if area 108 was next to 104 on a semiconductor wafer a step transition would be present if overburden values described above were within a 50–100 micron distance that included the step transition. This step transition would be a problem area during CMP. To solve this problem area, slots are formed or the number of slots are increased in area 104 to increase the overburden value. For example, slots can be formed to increase the overburden value in area 104 to 60%, with which there is no longer a large step transition and thus, no longer a problem area.

In one embodiment, a method for identifying areas of low overburden which degrade (increase) metal polish nonuniformity is discussed. Also described is a method for modifying these areas to increase their overburden, thus slowing down the metal polish rate and improving overall polish uniformity. Rather than focus on increasing layout density in low density areas, the focus is on the metal (e.g., Cu) overburden uniformity. Since it is often not practical to reduce overburden in high areas due to the presence of large fine-pitch structures with high overburden, there is not a principal focus on increasing metal density by tiling. (Although, tiling could be done in conjunction with the methods herein to achieve different or improved results.) Overburden in areas where metal density is high and overburden is low is the focus, resulting in an improvement of the overburden distribution, which improves polishing uniformity.

The term "width" as used herein to describe a metal feature is the minimum distance from the edge of a trench to an adjacent opposing edge. For example, in FIG. 5 the width of a conductor 112 is the distance from the left-most edge of portion 112a to the right-most edge of portion 112a. The oxide area 142b therefore divides the conductor 112 into multiple segments and the width of any segment is determined by the placement of the edges of that segment. The conductor 112 itself does not have a width except that it can be characterized by the width of its individual segments.

In one embodiment, a method of implementing polishing uniformity constructs an overburden distribution of a material on a substrate using layout data. To construct the overburden distribution a plating model for patterned material may be used.

From the overburden distribution at least one area having an overburden lower than a threshold amount is identified, the at least one area representative of a given density of patterned material. The overburden distribution may be a function of the layout data of the patterned material and a plating model of the patterned material, where the plating model for use in determining overburden across an area of the patterned material. Identifying the at least one area having an overburden lower than the threshold amount may include identifying a group of wide lines collected together. The group of wide lines collected together may be power bus lines or ground bus line. In one embodiment, the group of wide lines includes lines greater than approximately 5 µm in width, and wherein the group of wide lines comprises wide lines collected to greater than fifty percent (50%) density in an area comprising a width greater than an approximately 50 microns and a length greater than approximately 50 microns.

The layout date may be modified as a function of the at least one area, wherein modifying the layout data includes adding slots to the patterned material in the at least one area and concurrently maintaining a density of the material in the at least one area to be substantially the same subsequent to modifying the layout data.

In one embodiment, a method for modifying layout data of a material on a substrate for improving a polishing uniformity of the material on the substrate during a polishing of the same includes identifying at least one location within the layout data having wide lines, identifying, as a function of the at least one location of wide lines, wide lines collected together, determining whether the wide lines collected together have an overburden below a given threshold; and responsive to a determination that the wide lines collected together have an overburden below the given threshold, modifying the layout to have a larger overburden while maintaining a substantially same density of the wide lines collected together. In one embodiment, the threshold amount includes a transition in the overburden density greater than a given percentage change in density within steps of an area of the material. In one embodiment, the transition in overburden density corresponds to a transition greater than approximately sixty percent (60%) in overburden density in steps approximately 50–100 µm.

In one embodiment, a method of modifying a layout design of a material on a substrate for improving a polishing uniformity of the same includes performing one of blurring and defocusing of an overburden distribution of the layout data to provide a modified overburden distribution of a layout data, determining from the modified overburden distribution of the layout data whether the modified overburden distribution of the layout data contains at least one area having an overburden density transition greater than a threshold amount, and responsive to a determination that the modified overburden distribution of the layout data contains at least one area having a transition greater than the threshold amount, modifying the layout data to reduce the transition within the at least one area having the transition greater than the threshold amount. In one embodiment, the modified overburden distribution comprises an excess overburden as a result of momentum plating, and wherein reducing the overburden within the at least one area includes reducing the excess overburden. In one embodiment, a polish uniformity control for the layout design of the material is additionally selectively improved. This may occur by selecting the threshold amount to facilitate tolerating a given range of density of the material on the substrate by using an upfront metal layout design procedure, a metal layout design mask preparation procedure, or a metal layout design repair procedure.

In another embodiment, a method for forming a semiconductor device includes providing layout data which includes an overburden distribution, a first area having a first density, at least one conductive feature, and a first ratio of conductive feature edges to the first area, wherein the first ratio is less than approximately 0.5 microns per microns squared, and a second area having a second density, wherein the second density is less than the first density and a difference between the first density and the second density is greater than approximately thirty percent (30%). A blurring or defocusing of the overburden distribution of the layout data is performed to provide a modified overburden distribution of the layout data. From the modified overburden distribution of the layout data whether a transition in overburden value between the first area and the second area is greater than a threshold amount is determined. At least one conductive feature in the first area is modified to create a second ratio of conductive feature edges to the first area, wherein the second ratio is greater than approximately 0.5 microns per microns squared.

Figure 1A:
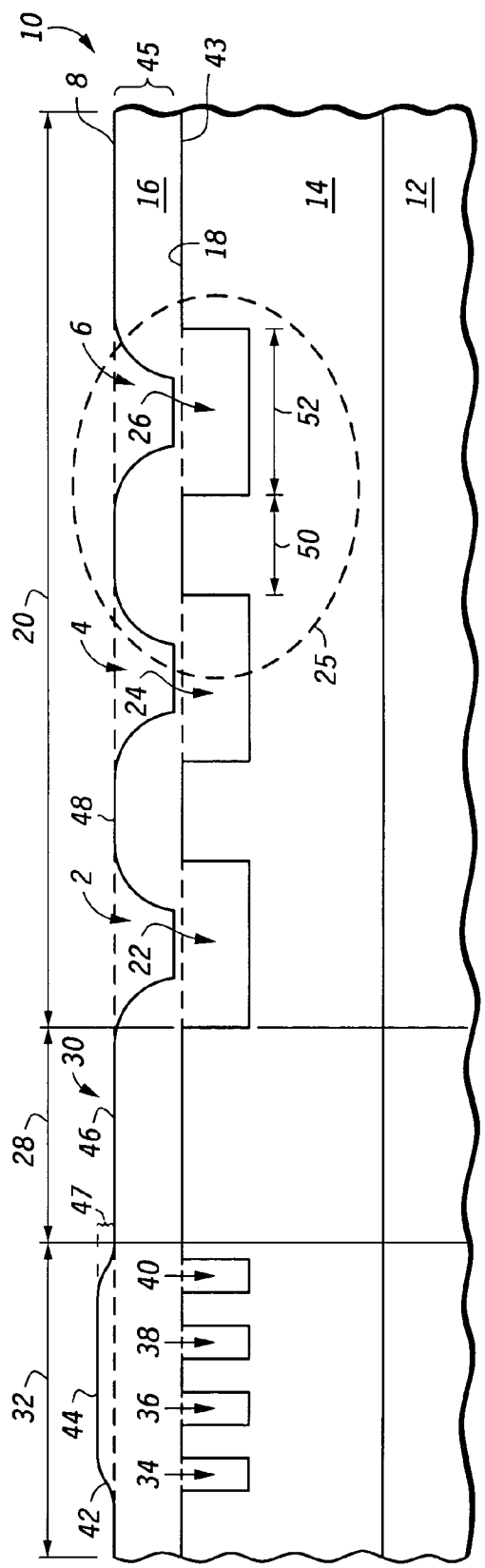
FIG. 1A illustrates in cross section a portion of a semiconductor device before planarization, wherein the semiconductor device in accordance with the prior art has a first area with narrow trenches, a second area that is empty, and a third area with wide trenches.

The methods may be better understood by turning to the figures. Illustrated in FIG. 1A is a cross-section of a semiconductor device 10 having a metal layer 16 formed over an interlevel dielectric (ILD) layer 14 and a semiconductor substrate 12. The metal layer 16 includes a fine pitch area 32, a dense and wide area (large pitch area) 20, and an empty area 28 between the aforementioned areas 20 and 32. The semiconductor substrate 12 can be any semiconductor material, such as gallium arsenide, silicon germanium, silicon-on-insulator (SOI), the like, and combinations of the above. The ILD layer 14 is a dielectric, such as silicon dioxide formed by tetraethylorthosilane (TEOS), fluorinated silicon dioxide (known in the industry as FTEOS), a low dielectric constant (low-k) material, the like or combinations of the above. The ILD layer 14 can be formed over the semiconductor substrate 12 by chemical vapor deposition (CVD), physical vapor deposition (PVD), thermal growth, the like, or combinations of the above. After formation, the ILD layer 14 is patterned using photolithography and etch processes known to a skilled artisan to form narrow trenches 34, 36, 38 and 40 in the fine pitch area 32 and wide trenches 22, 24 and 26 in the dense and wide area 20.

After patterning the ILD layer 14, the metal layer 16 is formed using CVD, PVD, electroplating, the like and combinations of the above. The metal layer 16 is preferably copper or a copper alloy due to copper's superior electrical properties compared to aluminum and other metals and metal alloys; any other metal or metal alloy, however, may be used. At the metal-dielectric interface 18, a barrier layer or multiple barrier layers, such as tantalum nitride, and/or copper plating layers may be formed before forming the metal layer 16. The barrier layer(s) are deposited to serve as diffusion barriers to protect the ILD layer 14. If the metal layer 16 is copper, the preferred method of formation is electroplating. To achieve electroplating, a copper seed layer should be formed over the ILD layer 14. Thus, if a barrier layer(s) is present at the metal-dielectric interface 18, the copper seed layer would be formed over the barrier layer(s). Subsequently, the metal layer 16 would be formed over the copper seed layer. Although not shown, devices and other layers known to one skilled in the art may be present in any portion of the semiconductor substrate. For example, transistors may be formed under the ILD layer 14.

The fine pitch area 32 includes the narrow trenches 34, 36, 38 and 40. The narrow trenches 34, 36, 38 and 40 do not need to all be the same width although none are greater than approximately two times the total thickness of the metal layer 16, typically 1 micron (1000 nm). When the metal layer 16 is formed over the narrow trenches 34, 36, 38 and 40 the metal layer 16 accumulates resulting in the height of the metal layer 16 being greater in the fine pitch area 32 than in the dense and wide area 20 and the empty area 28. If the metal layer 16 is formed by electroplating then the accumulation is caused by electroplating occurring at the bottom of the narrow trenches 34, 36, 38 and 40 first. (Although the bottom of the trenches is the low current density source during electroplating and thus should electroplate slower, a chemical used when electroplating metals, such as copper, adsorbs in the high current density areas and blocks electroplating in these areas. The result is that low current density areas fill faster.) If plating or any other conformal deposition process is used to form the metal layer 16, another reason the accumulation is due to the metal layer 16 depositing more on the sides of the narrow trenches 34, 36, 38 and 40 than on the bottom. If instead a process, such as sputtering, is performed, breadloafing, as excess build up at the top of a trench is commonly called in the industry, may occur and cause accumulation.

The excess undesired material that is formed in an area is termed overburden. Dashed line 43 illustrates the desired top surface (thickness or height) of the metal layer 16 that is desired after polishing. Line 43 will herein be referred to as the desired final surface height 43. (Line 43 is dashed in areas over trenches and is solid in areas coinciding with the metal-dielectric interface 18.) Due to the non-flat topography of the surface of the semiconductor device 10, the actual thickness of the metal layer 16 will most likely include overburden. The actual thickness that results from the plating process is illustrated by element 45. Overburden is the amount of thickness above the top most surface of the top layer of the semiconductor substrate. In other words, overburden is the amount of thickness formed over line 43. Overburden usually occurs over all areas of the wafer, but in some areas the excess undesired material is greater than other areas due to the topography of the wafer. As shown in FIG. 1A, the typical overburden 45 is approximately equal to the plating thickness 45.

Line 8 is the surface of the metal layer 16 in fine pitch area 32, empty area 28, and dense and wide area 20. 46 has an overburden value of approximately 100%, 44 has an overburden value greater than 100%, such as 120%, for example, and 43 has an overburden value of 0%.

In an empty area 28, the actual or plating thickness 45 is approximately equal to the distance between the desired final surface height 43 and the top surface 46 of the metal layer 16. As used herein, empty areas are devoid of circuit features, but may includes tiles or slots. Thus, the empty area 28 does not include any trenches or any active features. If tiles are included in the empty area 28, the overburden may be altered. For example, if small tiles that are similar to narrow trances 34, 36, 38 and 40 are formed, then the overburden may increase. If instead, the tiles are large enough, like the wide trenches 22, 24 and 26, the overburden may decrease.

In the fine pitch area 32, the amount of overburden is equal to the typical overburden 45 plus an excess overburden 47. The excess overburden 47 is the amount of overburden beyond that which is typical of all areas and is formed in the fine pitch area 32 because the narrow trenches 34, 36, 38 and 40 are in close proximity to each other. The metal density in the fine pitch area 32 may be greater than that in the dense and wide area 20 and also the empty area 28, but the fine pitch area 32 has more overburden (or overburden value) than that of the dense and wide area 20 and also the empty area 28. Thus, the amount of overburden is not a function of only the metal density. Instead, overburden is also dependent on features sizes.

In the dense and wide area 20 the average overburden is less than that in the empty area 28 because the wide trenches 22, 24 and 26 create low spots 2, 4 and 6. The low spots 2, 4 and 6 have less overburden over the wide trenches 22, 24 and 26. The dense and wide area 20 includes wide trenches 22, 24 and 26. Each of the wide trenches 22, 24 and 26 is wider than each of the narrow trenches 34, 36, 38 and 40 in the fine pitch area 32; the wide trenches 22, 24, and 26 do not need to be the same width as each other. Because the wide trenches 22, 24 and 26 are greater than two times the metal thickness 16 when the metal layer 16 is formed over them, the excess overburden is not formed. In one embodiment, the wide trenches 22, 24 and 26 are greater than 1 micron (1000 nm) and in another embodiment are greater than 1.5 microns (1500 nm) in width. In the embodiment where the wide trenches 22, 24 and 26 are very wide (e.g., greater than approximately 5 microns) as is typical for power and ground busses, there will be much less overburden than in the empty area 28 or the fine pitch area 32.

Figure 1B:
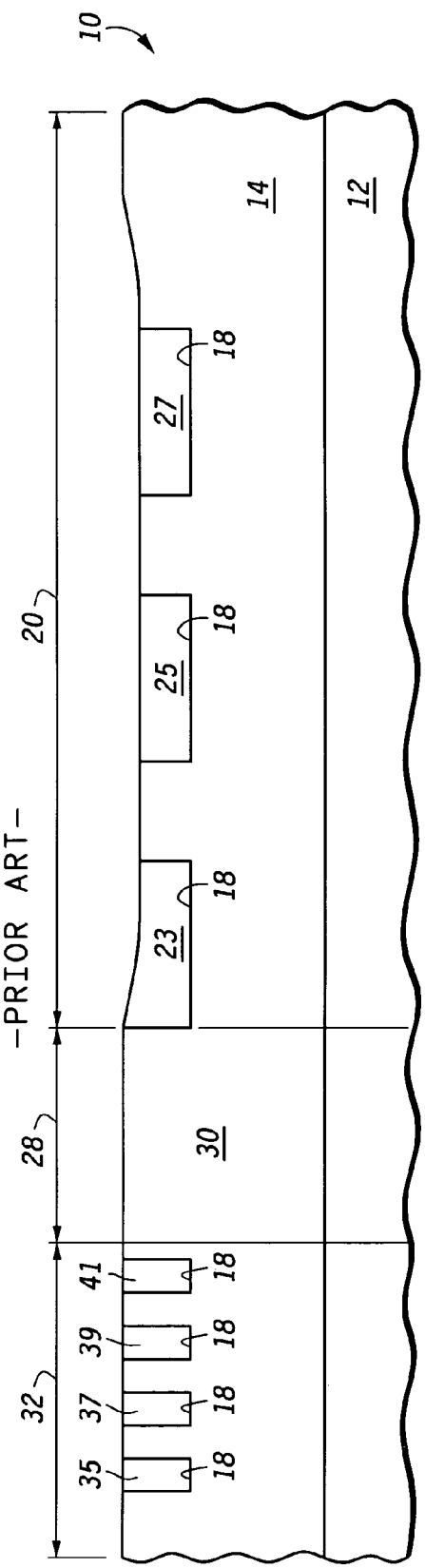
FIG. 1B illustrates the semiconductor device of FIG. 1A after planarization, which results in a nonuniform top surface over the first, second and third areas.

After forming the metal layer 16 over the ILD layer 14, the semiconductor device 10 is planarized by chemical mechanical polishing (CMP) to form first conductors 35, 37, 39 and 41 within the narrow trenches 34, 36, 38 and 40, respectively, and second conductors 23, 25 and 27 within wide trenches 22, 24 and 26, respectively. As shown in FIG. 1B, the planarity of the semiconductor device 10 is poor because the top surface in the dense and wide area 20 is overpolished. In other words the top surface in the dense and wide area 20 is lower than the top surfaces of the fine pitch area 32 and the empty area 28. The nonplanarity results from the different densities and line widths of structures on the semiconductor device 10 resulting in varying amounts of overburden, which causes different areas of the semiconductor device to polish at different rates. The dense and wide area 20 polishes faster than the empty area 28 and the fine pitch area 32, because the amount of overburden in this area is less. The fine pitch area 32 has the greatest amount of overburden of the three areas. Although the empty area 28 does not have as much overburden as the fine pitch area 32, it does have more overburden than the dense and wide pitch area 20. Since the empty area is between the fine pitch area 32 and the dense and wide area 20 the empty area is the transitional area in regards to the planarity of the ILD layer 14.

To improve planarity of the semiconductor device after planarization, the wide trenches in the dense and wide area 20 are altered or redesigned resulting in a modified dense and wide area 79, as shown in FIG. 2A. The wide trenches are decreased in width but remain separated by first and second spaces 56 and 60. The first space 56 is the modified space between the modified wide trenches 66 and 68 and the second space 60 is the modified space between the modified wide trenches 70 and 72. Slots 54, 58 and 62 are added to the modified dense and wide area 79 to increase the number of modified trenches 64, 66, 68, 70, 72 and 74. In other words, each wide trench 22, 24 and 26 is replaced with at least two modified (and narrower) trenches 64, 66, 68, 70, 72, and 74. It is important to recognize that although the number of trenches has increased and each trench is narrower, the layout density of the wide trenches and resulting conductors is not altered from that in FIGS. 1A and 1B. For example, if in FIGS. 1A and 1B the 3 trenches or conductors each have a width of 3 microns (3000 nm), the total width of trench or conductor is 3 times 3 or 9 microns (3000 or 9000 nm). When modifying the dense and wide area 20 of FIGS. 1A and 1B, the total width of trench or conductor is approximately equal to 9 microns (9000 nm). To achieve this the three (3) trenches or conductors are increased to six (6) trenches or conductors each with half the width of the wide trenches or conductors of FIGS. 1A and 1B, i.e., the six trenches are each now 1.5 microns wide. In other words, since the number of trenches or conductors doubled the width of each one is cut in half, resulting in the same total width of trench or conductor in the modified and non-modified dense and wide areas 79 and 20, respectively.

After planarization a conductor will be formed in each modified trench 64, 66, 68, 70, 72 and 74. Thus, the number of conductors to be formed is increased while the width of each of the conductor is decreased. This increases the amount of overburden in the modified dense and wide area 79, thereby decreasing the polishing speed of the modified dense and wide area 79 so that it is closer to the speed of the fine pitch area 32 and the empty area 28. Thus, the semiconductor device 11 after planarization has uniform top surface, as shown in FIG. 2B.

To better understand the benefits of the modified dense and wide area 79, it is desirable to compare the modified dense and wide area 79 with the dense and wide area 20. To assist with the comparison, a portion 5 of the dense and wide area 20 is enlarged in FIG. 3A and a portion 78 of the modified dense and wide area 79 is enlarged in FIG. 3B.

Figure 3A:
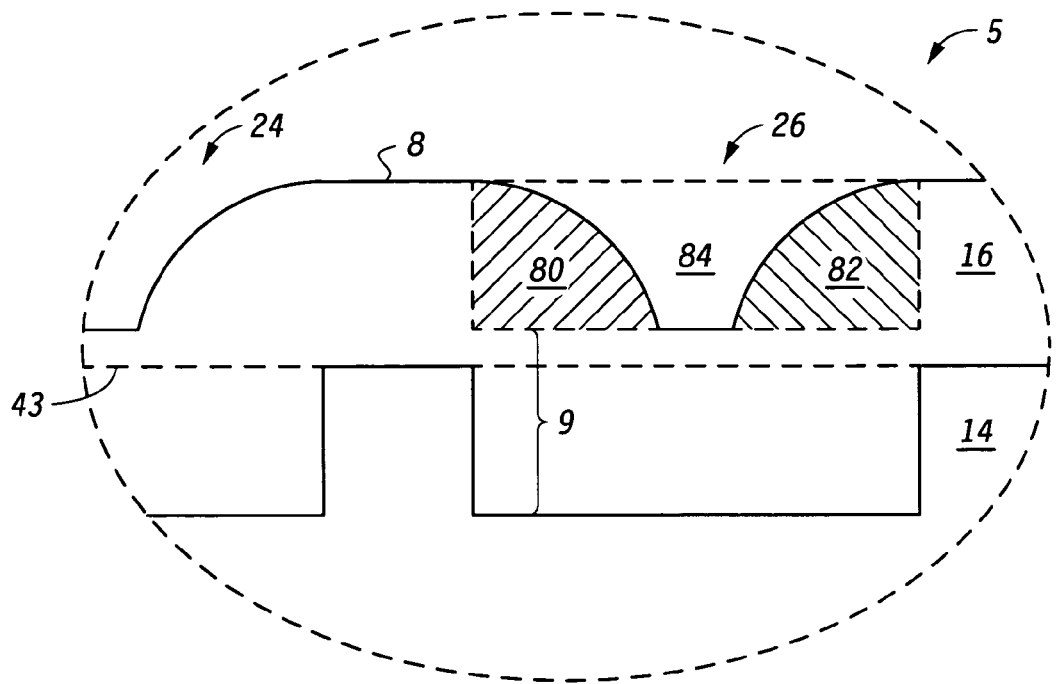
FIG. 3A illustrates an enlarged portion of FIG. 1A.

In FIG. 3A, the portion 5 of the prior art includes sections of the dielectric layer 14 and metal layer 16. Two portions of the metal layer 16 that are above the wide trench 26 are the shoulders 80 and 82 of the metal layer 16. The shoulders 80 and 82 are shaded for convenience; the shoulders 80 and 82 are not a different material from the metal layer 16 and instead, are just a subsection of the metal layer 16. The left shoulder 80 and the right shoulder 82 are located towards the left and right sidewalls of the wide trench 26, respectively. In other words, the shoulders 80 and 82 are the portions of the metal layer 16 that lie over the wide trench 26 and above the lower point of surface or line 8. Thus, the shoulders 80 and 82 are above a fill thickness 9 of the wide trench 26. The fill thickness 9 is the amount of material that is within the trench 26 when plating is approximately equal to typical overburden 45. As shown in FIG. 3A, the left shoulder 80 is laterally adjacent the right shoulder 82 but is not abutting the right shoulder 82.

Figure 3B:
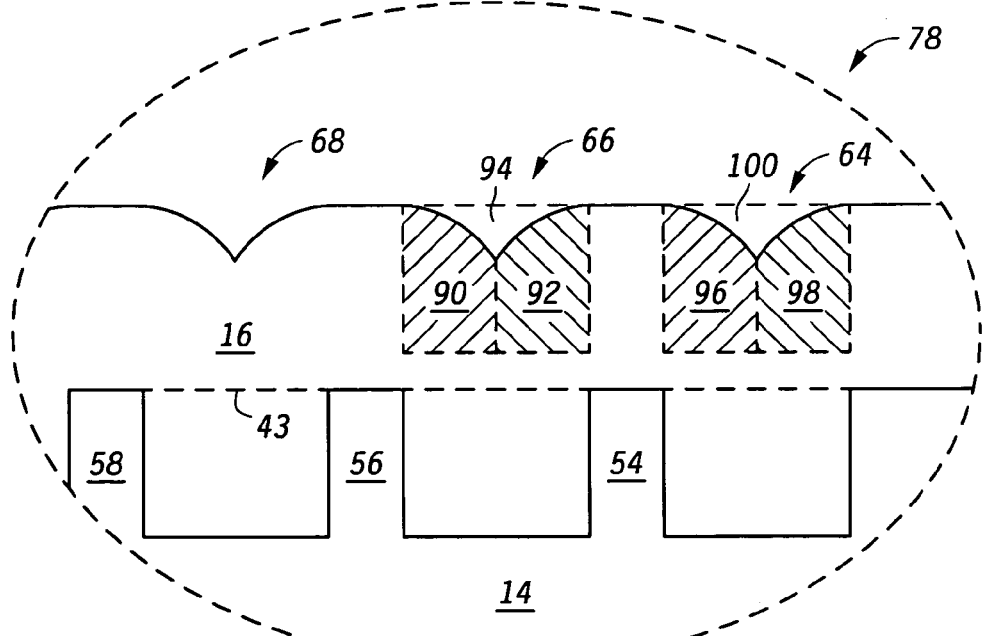
FIG. 3B illustrates an enlarged portion of FIG. 2A.

The portion 78 in FIG. 3B, which illustrates one embodiment of the present invention, includes sections of the ILD layer 14 and the metal layer 16. Lying above the modified trenches 64 and 66, shoulders 90, 92, 96 and 98 of the metal layer 16 are shown shaded in for convenience. (Shoulders are also present above the modified trench 68 and the other modified trenches 70, 72 and 74, which are not shown. For simplicity, only shoulders above two of the modified trenches are illustrated although the shoulders are present above all of the modified trenches.) The shoulder 90, 92, 96 and 98 are the same material as the metal layer 16 since they are just a subsection of it. The left shoulders 90 and 96 are located near the left sidewall of the modified trenches 66 and 64, respectively. Similarly, the right shoulders 92 and 98 are located towards the right sidewall of the modified trenches 66 and 64, respectively. In other words, the shoulders 90 and 92 are portions of the metal layer that lie over the modified trench 66 and the shoulder 96 and 98 are the portions of the metal layer that lie over the modified trench 64. Furthermore, the shoulders 90, 92, 96 and 98 are above the lowest point of the metal layer 16 (i.e., the lowest point of surface 8).

In the modified dense and wide region 78 the left shoulders 90 and 96 are abutting the right shoulders 92 and 98, respectively. In the dense and wide region 20, however, there is a gap or space between the left shoulder 80 and the right shoulder 82. The sum of the areas of the two sets of opposing shoulders 90, 92, 96 and 98 in the modified dense and wide region 78 is greater than the total areas of the shoulders 80 and 82 because the trench width was narrowed and more trench edges were created. The more trench edges allows for more shoulders to be formed over them. This can easily be determined by examining the area that is not filled with the metal layer 16 but would be filled if the trench was not present. In other words, the area above and between, if applicable, the shoulders that is not filled by the metal layer and is under the highest surface of the metal layer which is labeled as 84 in FIGS. 3A and 94 and 100 in FIG. 3B can be examined to compare the area of the spacers. The region 84 is larger the combination of regions 94 and regions 100. Thus, the total area of the spacers 80 and 82 in FIG. 3A is less than that of the sum of spacers 90, 92, 96 and 98 in FIG. 3B.

A larger shoulder area is desirable because it indicates increased overburden and decreases the rate at which the modified dense and wide area 78 will polish. The presence of more material above the modified trenches 66 and 64 supports the CMP pad and provides resistance during polishing. The increased resistance reduces the polish rate and minimizes or eliminates dishing during planarization.

Figure 5:
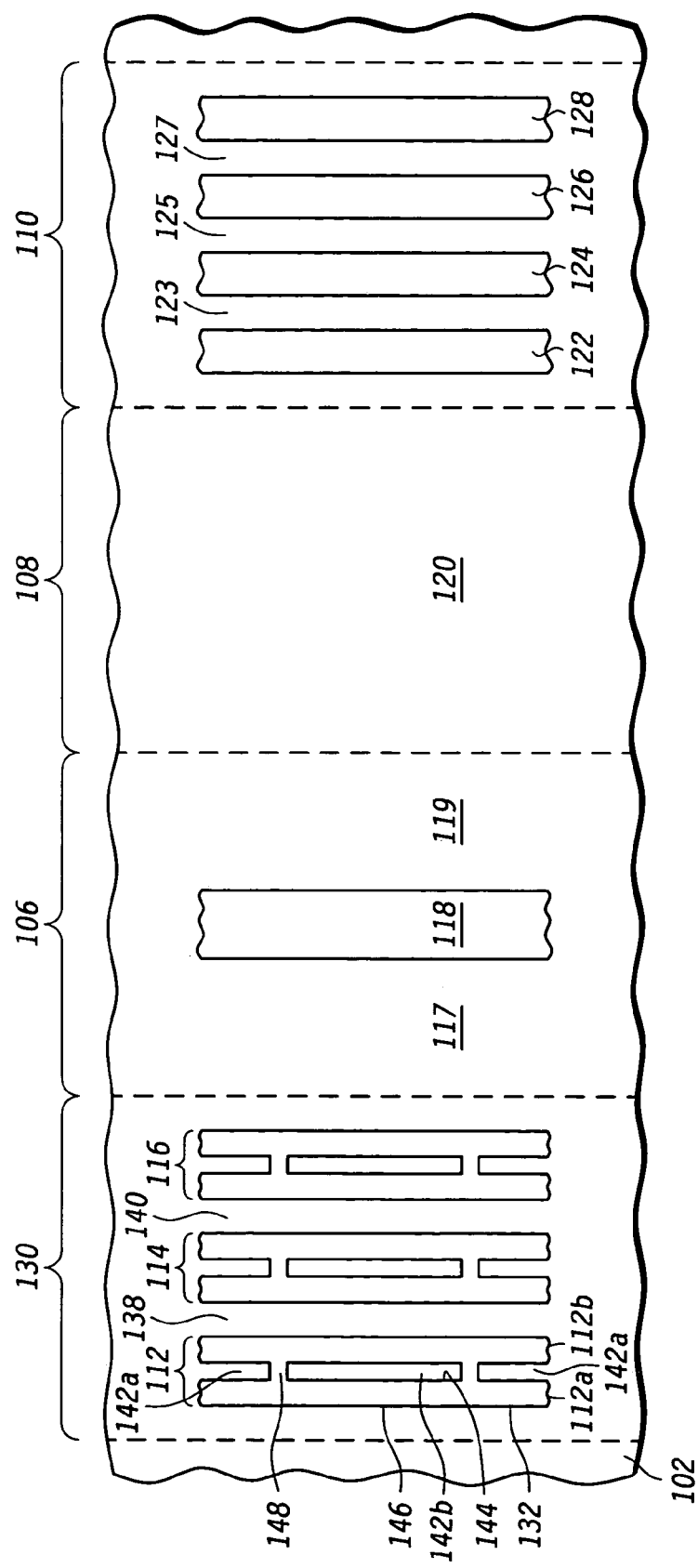
FIG. 5 illustrates a modifications to the semiconductor wafer shown in FIG. 4 in accordance with an embodiment of the present invention.
Figure 6:
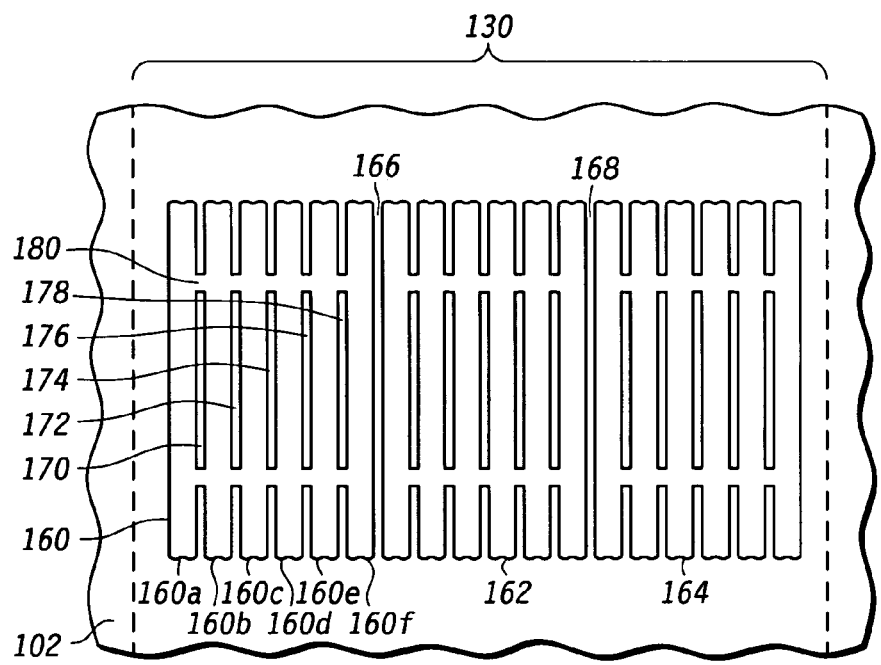
FIG. 6 illustrates another embodiment of the modifications to the semiconductor wafer of FIG. 4.

Structures of the modified dense and wide area 78 in accordance with some embodiments of the invention can be better understood by FIGS. 4–6, which illustrate top views of a portion of a semiconductor wafer. In addition, FIGS. 4–6 illustrate one embodiment of implementing the present invention on semiconductor device with the four common types of layout density areas that are often present on many semiconductor wafers.

FIG. 4 is a top-view of a portion of a semiconductor wafer 102 before implementing the present invention. The semiconductor wafer 102 has a dense and wide area 104, a wide isolated area 106, a low density area 108, and a fine pitch area 110. Any combination of any number of the areas 104, 106, 108 and 110 may be present on the semiconductor wafer 102 and the configuration and combinations are not limited to that illustrated. The dense and wide area 104 includes a plurality of wide conductors 112, 114, and 116. The conductors 112 and 114 are adjacent each other and are separated by space or distance 113, and space 115 separates the conductors 114 and 116, which are adjacent each other. The number of conductors 112, 114, and 116 in the dense and wide area 104 is not limited to three, as illustrated; instead, any number of conductors equal to or greater than two can be present in the dense and wide area 104. For simplicity, the width of the conductors shown 112, 114 and 116 are equal; however, they can all have different widths.

The wide isolated area 106 includes a single wide conductor 118 that can be at least as wide as any or all of the conductors 112, 114 and 116. The single wide conductor 118 is separated from other areas of the semiconductor wafer 120 by spaces 117 and 119, which are wider than the spaces 113 and 115.

The empty area 108 does not include a conductor; however, in one embodiment it may include tile(s). Any tile configuration, especially that previously explained may be used. In addition, slots may be used. The fine pitch area includes fine pitch conductors 122, 124, 126 and 128 that are separated from each other by spaces 123, 125, and 127. Fine pitch areas may be found in memory arrays especially in lower metal levels. Wide dense areas may be found where power and ground are provided. For example, wide dense areas may be found between memory arrays, around a chip's edges near input/output (I/O) cells, and in upper metal levels.

In accordance with one embodiment, the wide conductors 112, 114 and 116 in the dense and wide area 104 are modified to form the dense and reduced pitch area 130, shown in FIG. 5. For simplicity, only the wide conductor 112 has been numbered and hence will be the only wide conductor to which reference is made when discussing the modifications of all of the wide conductors 112, 114, and 115. In addition, it is not necessary that all of the wide conductors 112, 114 and 115 be modified or be modified in the same manner.

With respect to the wide conductor 112, it has been transformed into a new shape having approximately the same layout area. The new shape includes a left portion 112a and a right portion 112b that each have a smaller width than the width of the wide conductor 112 before modification. The total width of 112a and 112b is approximately equal to the width of wide conductor 112. To achieve this, space or distance 138 is less than the space or distance 113 in FIG. 4. Likewise, space or distance 140 is less than space or distance 115. Furthermore, the left portion 132a and the right portion 132b are electrically coupled in the layer in which they are formed or, alternatively, in another layer so that they are on the same electrical net.

The wide conductor 112, as illustrated in FIG. 5 was split at least once forming the left portion 112a and the right portion 112b, but can be split any number of times. In other words, at least one slot, which includes the inner portion 142b and the two outer portions 142a, is formed between the left portion 112a and the right portion 112b. The slot 142a and 142b (combined) can be separated into different portions due to crossbars 148 electrically coupling the left portion 112a and the right portion 112b to each other. Any number of crossbars can be used to form the electrical connection. In other embodiment, the left portion 112a and the right portion 112b can be coupled to each other in different manner.

The different portions 142a and 142b are considered one slot because together they are the spaces that separate two main portions of the modified conductor 112a and 112b. In other words, if it wasn't for the crossbars that are substantially smaller than the main portions of the conductors 112a and 112b and are present so that the main portions are electrically coupled to each other, then there would be one slot. In addition, the portions 142a and 142b are considered one slot with different portions because the portions 142a and 142b are adjacent each other in a direction that is parallel to the main portions 112a and 112b of the conductor. The left portion 112a and the right portion 112b are considered the main portions because they are largest in conductor area.

The width of each of the left portion 112a and the right portion 112b is substantially smaller than the width of the wide conductor 112 before modification. In one embodiment, each of the left portion 112a and the right portion 122b is approximately equal to 1.5 microns (1500 nm), whereas the wide conductor 112 was originally 3 microns (3000 nm).

Another way to view the change to the wide conductor 112, is that it has been modified to include enclosed space or (internal slot) 142b. The enclosed space has an internal perimeter 144, which has two opposite sides formed by a section of the right wall of the left conductor 112a and a section of the left wall the right conductor 112b. The other two sides of the internal perimeter 144 are formed by a side of the crossbars 148. The crossbar 148 above the internal slot 142b provides its lower side to be part of the perimeter and the crossbar 148 below the internal slot 142b provides its top side to be part of the internal perimeter 144. The conductor 112, which includes the left conductor 112a, the cross bars 148 and the right conductor 112b, has external perimeter 146. The external perimeter 146 traces the outer most or exposed sides of the left conductor 112a, the cross bars 148 and the right conductor 112b. No portions of the internal perimeter 144 and the external perimeter 146 overlap or coincide with each other. The modification of the wide conductor 112 to form the left conductor 112a, the cross bars 148 and the right conductor 112b results in the sum of the internal perimeter and the external perimeter being substantially greater than the previous perimeter of the wide conductor 112 thus creating more trench edges over which to form shoulders, increasing overburden and decreasing polishing rate.

In another embodiment, the dense and reduced pitch area 130 includes at least modified conductors 160, 162 and 164, as shown in FIG. 6. The first modified conductor 160 is separated from 162 by space or insulative region 166 and second modified conductor 162 and third modified conductor 164 are separated by space or insulative region 168. The first conductor 160 is modified to form a plurality of subconductors 160a–f. Additionally, the first conductor 160 has internal slots 170, 172, 174, 176 and 178, which are similar to internal slot 142b in FIG. 5 and can be a portion of a larger slot. In one embodiment, the internal slots 170, 172, 174, 176 and 178 are all the same size and shape; however, the size and/or shapes of each of the internal slots can differ from any or all others. The plurality of subconductors are electrically coupled to each other by, for example, crossbar 180. All three conductors do not have to be the same; they can have different pitches meaning they are separated from each other by different distances.

A skilled artisan recognizes that the number of portions (and slots) shown in FIGS. 5 and 6 are representative and thus any additional number of slots, portions of slots or portions of the conductor can be formed. The limitation of the maximum number of slots, portions of slots, or portions of the conductor that the conductor can be split into depends on the minimum spacing between lines that is allowed by the design rules. Typically design rules allows narrow lines to be placed closer together than wide lines, although the minimum width and minimum spaces are limited by photolithographic capability. The number of portions is determined based on the width of the portions so that the density before and after modification is approximately the same. Thus, the slots between the subconductors 160a–f and the spacing between the conductors 160, 162 and 164 is less than the slots between the subconductors 112a and 112b and the spacings between the conductors 112, 114 and 116 so that the density remains the same for the dense and reduced pitch area 130 in FIGS. 5 and 6 as it was in the dense and wide area 104 in FIG. 4 before modification.

Figure 7:
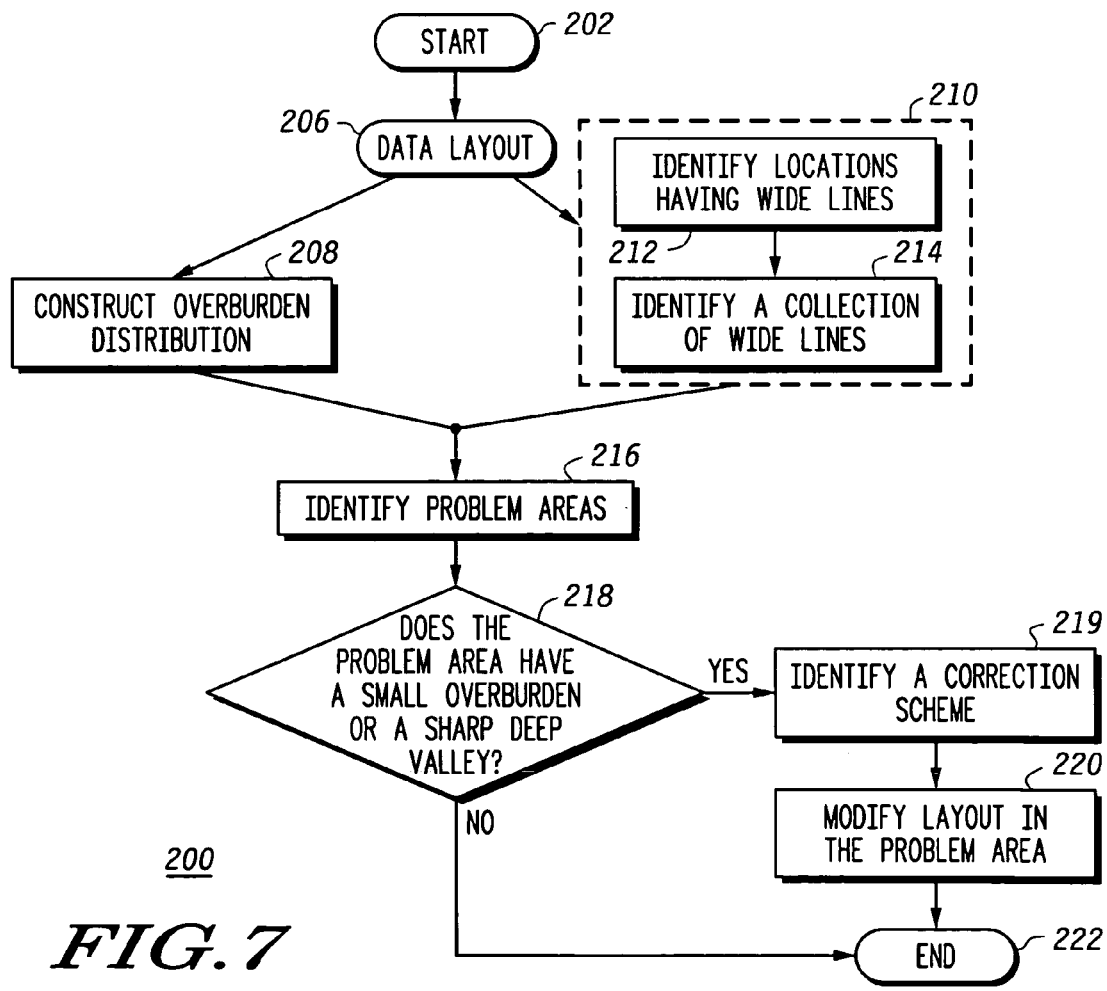
FIGS. 7–8 illustrate flow diagrams used to modify a semiconductor wafer in accordance with an embodiment of the present invention.

A first flow 200 in FIG. 7 begins by providing a start 202. First layout data is obtained in block 206. In one embodiment, the layout data is generated by a computer using, for example, an electronic database. Next, the block 208 is performed where a (metal) overburden distribution is constructed according to a fill or plating model to determine the high and low overburden regions.

In one embodiment, the overburden distribution is determined by finding the area densities of lines of different widths in a predetermined area, assigning an overburden percentage to the different area densities and then calculating the sum. More specifically, layout features are separated into bins according to their widths. Specifically, the layout features are separated into five bins: 1) widths larger than 5 microns; 2) widths from 2.5 to 5 microns; 3) widths from 1 to 2.5 microns; 4) widths from 0.5 to 1 micron and 5) widths below 0.5 microns. The separation is accomplished using sizing and Boolean commands in common design rule checker (DRC) tools. After the separation, the entire layout area is divided evenly into non-overlapping cells, each of approximately 50 microns by 50 microns in size, and the area densities of layout features in each cell is surveyed for every bin. The density commands in common DRC tools can be used to accomplish the survey. After the survey, density information from the layout is now composed of five matrices for the five bins with each element in the matrix representing the amount of area occupied by layout features in a certain range of widths at that location. M__5, M__2.5, M__1, M__0.5 and M__0 are the five matrices for the five bins, respectively. (In the following examples, the metal layer 16 is copper.) The copper overburden distribution matrix is $$M\_Cu = (1 - M\_5 - M\_2.5 - M\_1 - M\_0.5 - M\_0) + 0.1*M\_2.5 + 0.2*M\_1 + 0.5*M\_0.5 + 1.5*M\_0,$$

where all operations are scalar matrix operations. M_Cu is then the copper overburden distribution of the layout after copper plating.

Process 210 includes blocks 212 and 214. Locations having wide lines are identified as shown in the block 212. Although not shown, the block 212 can be achieved, in one embodiment, by looking at predetermined intervals using matrix M__5 or M__2.5 from block 208. Preferably, the wide lines are 5 microns in width. However, the width may differ depending on a process used. Typically, the wide lines are larger than 3 microns in width. From the locations having wide lines, regions where there are wide lines collected together (meaning they span at least approximately 50 microns (50,000 nm)), are identified, as shown in block 214. Alternatively, locations can be identified by any one or consecutive elements larger than 0.5 or 0.6 in matrix M__5 or M__2.5, if present.

The collected wide lines locations and overburden distribution are combined together to identify problem areas as shown in block 216. The problem areas are those locations with wide lines collected and low overburden or with sharp transition in value nearby. In one embodiment, the problem areas are low overburden areas. Preferably, a low overburden is greater than or equal to approximately zero (0) and less than or equal to approximately 0.5, or more preferably the low overburden area is greater than or equal to approximately zero (0) and less than or equal to approximately 0.25. In one embodiment, the lower overburden is greater than approximately 0.4 and less than approximately 0.5.

In another embodiment, the problematic area is where the distribution of overburden values form valley transitions (e.g., high to low to high) indicating sharp deep valley that needs to be smoothed is present. It is more difficult to polish an area that is a valley transition than an area with just one edge/step (i.e., a high to low area or a low to high area or step transition) because in the former situation (i.e., valley transistions), twice as much material needs to be polished as compared to the latter situation (i.e., step transistions). In another embodiment, if the step transition (i.e., high to low or low to high) is large enough (i.e., the difference in overburden values is larger than 0.5), this step transition is also a problem area. Thus, in decision diamond 218 if the problem area has a small overburden, a sharp deep valley, or a large step transition, then a correction scheme is identified 219 according to the local geometries in the problem area and the layout is modified in the problem area as shown in block 220 in accordance with the embodiments above. Then, the first flow 200 proceeds to end 222. Instead, if the problem area does not have a small overburden or a sharp deep valley or a large step transition then the layout is not modified and the first flow proceeds to end 222 after the decision diamond 218.

Figure 8:
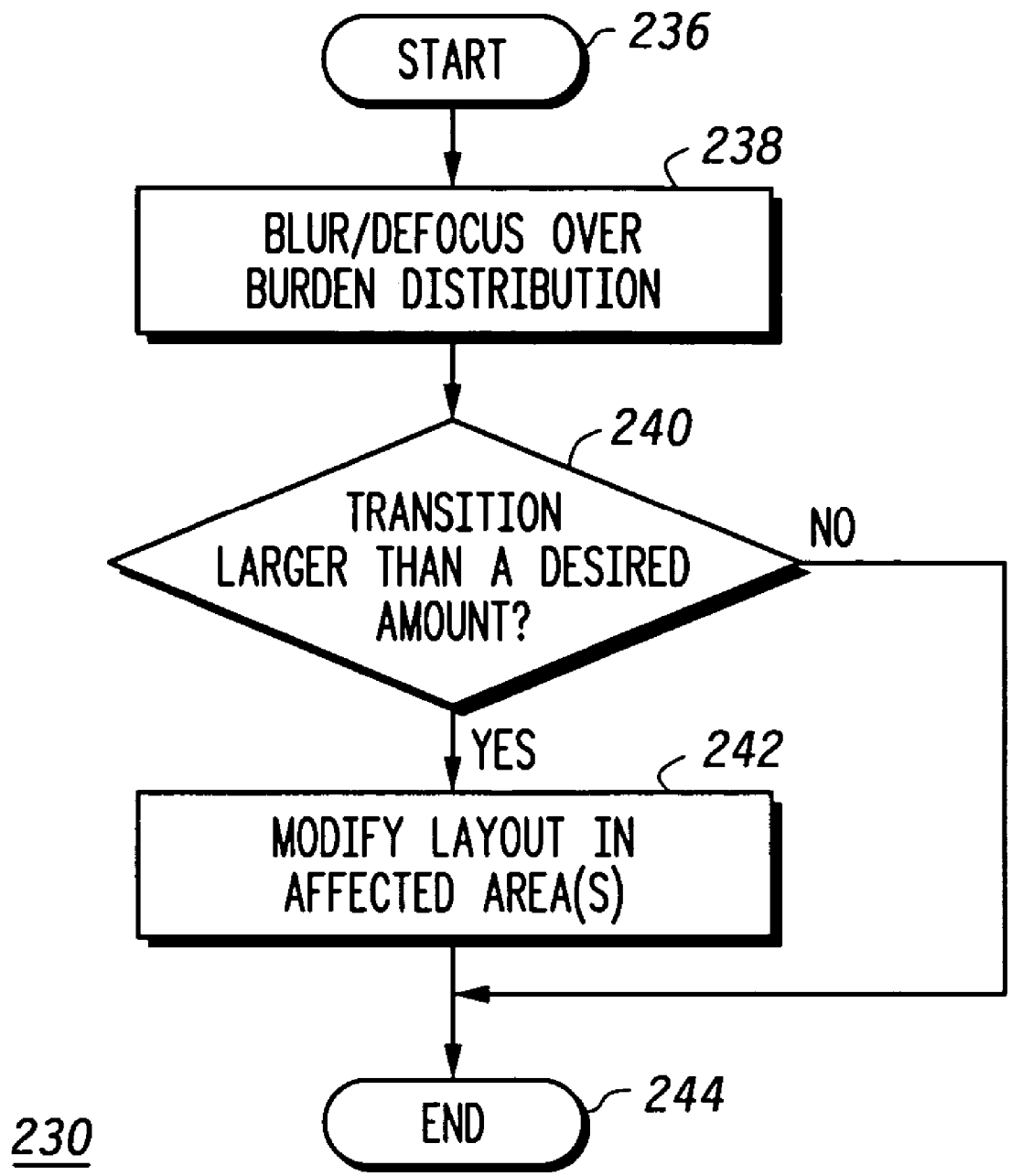

Another process to find a problem is shown in a second flow 230 in FIG. 8. The second flow 230 begins with start 236. First, the overburden distribution from process 208 of FIG. 7 is blurred or defocuses as described in block 238. Next, in the decision diamond 240 it is determined if the transition is larger than a desired amount. The blurred map of the overburden distribution identified the potential regional high and low spots after CMP. A transition is the difference between any high and low spots. If the transition is not larger than a desired amount then the second flow proceeds to end 244. Instead, if the transition is larger than a desired amount then the layout is modified in any affected areas, as described in block 242, in accordance with the embodiments above. The amount depends on how the blurring is done, which is a reflection of the CMP process. Typically, the desired amount, when translated in to height, should be within the specifications or parameters that the process is designed to tolerate.

The blurring in process 238 may be done using the following equation: M_CuW=H_regional, where is a two-dimensional convolution calculation. In other words, the regional heights are the copper overburden distribution (M_Cu) convolved with a weighing function W. Final heights are the normalized products of regional heights and overburden distribution as evidenced by the following equation: H≡H_regional•×M_Cu, where •×is the scalar matrix multiplication (element-to element multiplication) of two matrices. (M_Cu can also be viewed as the local height distribution.)

In one embodiment, the transition is less than approximately 500 Angstroms (50 nm). In theory for this embodiment, heights of materials after CMP (chemical mechanical processing) is $\Delta H = zd'\rho(1-\alpha+\rho eff')$, where $\rho eff' = [\rho eff - min(\rho eff)]/range(\rho eff)$; $\rho eff = \rho W$; $\rho = M\_Cu$; $zd' = zd \cdot range(\rho eff)$; $range(\rho eff) = max(\rho eff) - min(\rho eff)$; $\alpha = avg(\rho)$; w=blurring filter for the CMP process, and zd=height of Cu plating over open area (i.e., Cu thickness, nominal, before CMP). The ρeff obtained in process 238 in this embodiment is the same as the H_regional described above.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more.

The invention claimed is:

1. A method of implementing polishing uniformity, said method comprising:
   providing layout data;
   constructing an overburden distribution of a material on a substrate using the layout data;
   identifying from the overburden distribution at least one area having an overburden lower than a threshold amount, the at least one area representative of a given density of patterned material; and
   modifying the layout data as a function of the at least one area, wherein modifying the layout data includes adding slots to the patterned material in the at least one area and concurrently maintaining a density of the material in the at least one area to be substantially the same subsequent to modifying the layout data.

2. The method of claim 1, wherein the overburden distribution is a function of the layout data of the patterned material and a plating model of the patterned material, the plating model for use in determining overburden across an area of the patterned material.

3. The method of claim 1, wherein constructing the overburden distribution further comprises constructing the overburden distribution according to a plating model for the patterned material.

4. The method of claim 1, wherein identifying the at least one area having an overburden lower than the threshold amount further comprises identifying a group of wide lines collected together.

5. The method of claim 4, wherein the group of wide lines comprises lines greater than approximately 5 μm in width, and wherein the group of wide lines comprises wide lines collected to greater than fifty percent (50%) density in an area comprising a width greater than an approximately 50 microns and a length greater than approximately 50 microns.

6. The method of claim 4, wherein the group of wide lines collected together comprise at least one of the group consisting of power bus lines and ground bus lines.

7. The method of claim 1, wherein the at least one area includes a group of wide lines, and wherein adding slots to the at least one area includes adding slots to the group of wide lines to reduce spacing between each of the wide lines, reduce a width of each of the wide lines, and increase a number of wide lines in the group of wide lines, while maintaining a density of the wide lines substantially the same subsequent to adding slots to the at least one area.

8. The method of claim 1, wherein the patterned material includes a metal.

9. The method of claim 8, wherein the metal includes copper.

10. A method of implementing polishing uniformity control for a material on a substrate to be polished, said method comprising:
    constructing an overburden distribution of a pattern on the substrate as a function of layout data of the pattern;
    identifying from the overburden distribution at least one area of the pattern as a function of overburden that has an overburden lower than a threshold amount, the at least one area further being of a given density; and
    modifying the layout data as a function of the at least one area, wherein modifying the layout data includes adding slots to the at least one area and concurrently maintaining a density of the at least one area to be substantially the same subsequent to modifying the layout data of the pattern.

11. A method for modifying layout data of a material on a substrate for improving a polishing uniformity of the material on the substrate during a polishing of the same, said method comprising:
    identifying at least one location within the layout data having wide lines;
    identifying, as a function of the at least one location of wide lines, wide lines collected together;
    determining whether the wide lines collected together have an overburden below a given threshold; and
    responsive to a determination that the wide lines collected together have an overburden below the given threshold, modifying the layout to have a larger overburden while maintaining a substantially same density of the wide lines collected together.

12. The method of claim 11, wherein the wide lines include lines greater than approximately 5 μm in width, and wherein the group of wide lines collected together include wide lines collected to greater than approximately fifty percent (50%) density in greater than an area having approximately 50 microns in width and approximately 50 microns in length.

13. The method of claim 11, wherein overburden is determined as a function of a plating model of the material.

14. The method of claim 11, wherein determining whether the wide lines collected together have an overburden below a given threshold further comprises determining the overburden as a function of a plating model for plating of the material on the substrate.

15. The method of claim 11, wherein modifying the layout data further comprises adding slots to the wide lines collected together for increasing the overburden above the given threshold and concurrently maintaining substantially the same density as that of the material of the wide lines collected together.

16. The method of claim 11, wherein the material includes a metal.

17. The method of claim 16, wherein the metal includes copper, and wherein a pattern of copper according to the modified layout data is designed for being planarization by chemical mechanical polishing (CMP).

18. The method of claim 11, wherein the wide lines collected together comprise at least one of the group consisting of power bus lines and ground bus lines.

19. The method of claim 11, wherein the layout data is used for creating a the material on the substrate to be polished via chemical-mechanical polishing (CMP).

20. The method of claim 11, wherein the slots added to the wide lines collected together act to reduce spacing between each of the wide lines, reduce a width of each of the wide lines, and increase a number of wide lines and concurrently maintain substantially the same density of material.

* * * * *